United States Patent [19]
Gell et al.

[11] Patent Number: 4,528,048
[45] Date of Patent: Jul. 9, 1985

[54] MECHANICALLY WORKED SINGLE CRYSTAL ARTICLE

[75] Inventors: Maurice L. Gell, Newington; Anthony F. Giamei, Middletown, both of Conn.

[73] Assignee: United Technologies Corporation, Hartford, Conn.

[21] Appl. No.: 447,066

[22] Filed: Dec. 6, 1982

[51] Int. Cl.³ .................................................. C22F 1/10
[52] U.S. Cl. ...................................... 148/404; 148/39; 416/241 R
[58] Field of Search .......... 416/241 R; 148/2, 11.5 N, 148/12.7 N, 162, 404, 409, 39; 420/590; 29/156.8 R, 156.8 B, 156.8 H; 428/637

[56] References Cited

U.S. PATENT DOCUMENTS

| | | | |
|---|---|---|---|
| 3,228,095 | 1/1966 | Bird et al. | 29/156.8 |
| 3,494,709 | 2/1970 | Piearcey | 148/404 |
| 3,642,543 | 2/1972 | Owczarski et al. | 148/12.7 |
| 4,184,900 | 1/1980 | Erickson et al. | 416/241 R |
| 4,345,950 | 8/1982 | O'Hara | 148/404 |
| 4,392,894 | 7/1983 | Pearson et al. | 148/2 |

Primary Examiner—L. Dewayne Rutledge
Assistant Examiner—Robert L. McDowell
Attorney, Agent, or Firm—C. G. Nessler

[57] ABSTRACT

A single crystal nickel base superalloy component, such as a gas turbine blade (20, 28) is mechanically deformed at elevated temperature to improve the yield strength of a portion which is used at temperatures below 800° C., compared to a portion which is used at a higher temperature. A blade (20) has a root (22) which is deformed by 2-14% at 700°-1100° C. and an airfoil (24) which is not deformed. The root yield strength is increased 15-50% while the airfoil creep strength is maintained.

6 Claims, 3 Drawing Figures

MECHANICALLY WORKED SINGLE CRYSTAL ARTICLE

TECHNICAL FIELD

The present invention relates to single crystal superalloy articles, most particularly to gas turbine blades made of nickel alloys.

BACKGROUND

Gas turbine engines, particularly those used in aircraft applications, place an unusual demand on materials used in the high temperature portions of the engine. For example, in the turbine section of an engine, a 1100°–1500° C. gas stream impinges on a multiplicity of air cooled blades mounted around the rim of a spinning disk. The parts are thus subjected to a severe combination of high axial loads and high temperatures. Over the past 40 years there has been considerable technical effort directed toward producing improved materials and designs to optimize the performance of the high temperature components in a gas turbine engine. Initially, forged stainless steels and nickel chromium alloys were used; later, these were superseded by gamma prime containing superalloys. However, as the gamma prime content of alloys was increased over time, the alloys became non-forgeable; this led to the use in the 1960's of cast turbine blades. In the 1970's, advances in casting technology led to the introduction of directionally solidified columnar grain alloys having greatly improved creep strength, as disclosed in U.S. Pat. No. 3,260,505 to VerSnyder. Currently, directionally solidified single crystal alloy parts, as disclosed in U.S. Pat. No. 3,494,709 to Piearcey, are in commercial use.

The foregoing progression of materials and processes has enabled gas turbine blades to be operated at progressively higher material temperatures and stresses. Still, there is demand for further improvements and the present invention seeks to satisfy these needs. Considering in more detail a gas turbine blade, it will be found that the airfoil portion of a blade has the highest material temperatures, resulting in a tendency toward failure by creep or thermal fatigue. The root portion of the blade, where it is held in the rim of the necessarily cooler disk, tends to be at a lower temperature. The root region tends toward failure due to mechanical fatigue or tensile yielding.

Nonetheless, if improved strength can be provided in a material for any particular hot or cold regime, then the designer of the gas turbine blade can reduce the amount of material which is needed in the portion subjected to that particular regime. When a part is thereby made lighter, there may be a magnified benefit in reduction in weight of all the structure supporting the turbine blade. Alternatively, the life of a part may be extended while maintaining it at its original configuration.

The metallurgical design of a single crystal alloy, as with most superalloys, is necessarily a compromise. Therefore, while there have been important advances in the chemistry and metallurgy of single crystals to produce improved low and high temperature properties, still further opportunities for improving performance are of economic interest.

Previously, Owczarski et al disclosed in U.S. Pat. No. 3,642,543 that the yield strength of certain single crystal alloys could be improved by hot rolling the alloys to about 40% reduction. At least 15% reduction was said to be necessary to get any improvement. However, the dimensions of gas turbine blades must be very precise and they are usually cast and machined to quite high tolerances. The intricate internal passages that characterize modern air cooled turbine blades usually must be cast into place for economy; machining such passages is generally infeasible and often impossible. Therefore, the previously described rolling procedure is not really pertinent to the present requirement.

DISCLOSURE OF THE INVENTION

An object of the present invention is to provide a single crystal gas turbine blade which has improved properties in the lower temperature operating regions, while maintaining excellent properties in the higher temperature regions.

According to the invention, a single crystal casting of nickel superalloy is selectively worked mechanically at an elevated temperature, to thereby strengthen the portion of the casting which is subjected to the lower use temperature. For example, the root of a gas turbine blade is deformed by 5–14% while the airfoil portion is left in the as-cast condition. Thus, the yield strength and mechanical fatigue properties of the root will be improved while the creep resistance of the airfoil will remain essentially as it was originally. In the invention, a heightened dislocation substructure is induced in the portions of the article which have the lower use temperature, while the portion of the article which is subjected to the higher use temperature is not worked, to avoid any tendency for recrystallization during use.

For single crystal nickel superalloys, working is undertaken isothermally at a temperature above 700° C. and below the gamma prime solvus of the alloy, preferably around 900°–1000° C. The deformation will be sufficient to deform the part by 2–25 percent, preferably 5–10 percent. The 600° C. yield strength of representative nickel superalloys will be increased by 15–50% or more by the deformation step. Low cycle ($\sim 10^5$ cycles) fatigue life at 760° C. will be increased up to three times.

Different procedures are useful in producing hollow air cooled blades having cooling air passages in the root. If the needed deformation is not great, the root can be cast hollow, with provision for some allowable closing of the passageways or subsequent machining to restore them. Alternately, a solid root can be machined after deformation; or removable mandrels can be inserted in a hollow root to preserve passage size during deformation.

The advantage of the invention is that higher stresses can be endured in the root portion of a gas turbine blade than is the case in the absence of working. This either can be used to reduce part weight, or to enable higher gas turbine rotor speeds and produce improved efficiency in the engine.

The foregoing and other objects, features and advantages of the present invention will become more apparent from the following description of preferred embodiments and accompanying drawings.

BEST MODE FOR CARRYING OUT THE INVENTION

The present invention uses the techniques of patent application Ser. No. 447,067 "Wrought Single Crystal Nickel Base Superalloy" filed on Dec. 6, 1982 by Giamei and Kear, the disclosure of which is hereby incorporated by reference. The related application describes how single crystal nickel superalloy can be thermal mechanically worked to thereby improve its yield and fatigue strength. In summary, the alloy must be isothermally worked at a temperature greater than 700° C. and less than the gamma prime solvus, preferably in the range 900°–1000° C., so that the plastic deformation is between 2–25%, preferably 5–14%. The yield strength increase will vary in magnitude according to the crystallographic axis orientation along which it is measured. Yield strength at 20° and 600° C. is increased from 15–40% for the alloy referred to as Alloy 1444 (by weight percent 5Al, 2Ti, 9Cr, 0.05C, 0.03B, 12W, 1Cb, balance Ni). The invention herein will be even more useful with other single crystal alloys such as those disclosed in U.S. Pat. Nos. 4,116,723, 4,209,348 and 4,222,794, and most notably the Alloy PWA 1480 of Pratt & Whitney Aircraft, East Hartford, Conn. Generally, the invention will utilize nickel base superalloys having 30 to 70 volume percent gamma prime. However, the invention may also be used with single crystals of other base alloys, where the alloy has a substantial volume percent of coherent precipitate. And of course the invention will be useful for other parts than the exemplary turbine blade described herein.

Figure 1:
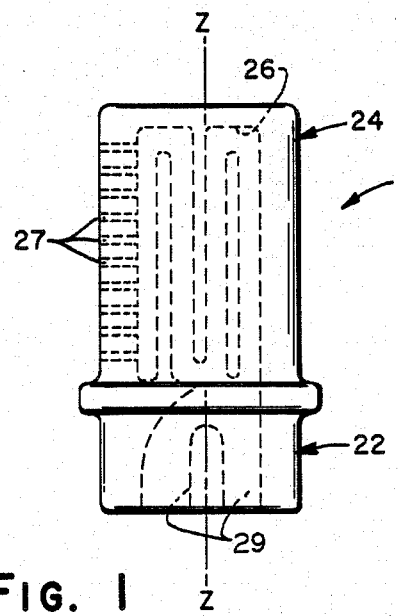
FIG. 1 shows a gas turbine blade having a root which has been subjected to thermal mechanical working and an as-cast airfoil portion.

In the invention, a typical single crystal blade like that shown in FIG. 1 is cast from Alloy 1444 with a [001] longitudinal (z) crystal axis orientation, according to the known commercial techniques, as initially taught by Piearcey in U.S. Pat. Nos. 3,494,709 and 3,536,121. See also U.S. Pat. No. 4,190,094 to Giamei. After casting the part is subjected to a solution heat treatment at 1290° C. followed by air cooling, or other heat treatment, which has the effect of homogenizing the alloy and providing a uniform distribution of finely spaced gamma prime. The gamma prime solvus temperature of Alloy 1444 is about 1255° C.

Referring to FIG. 1, the cast gas turbine blade 20 has a root portion 22 and an airfoil portion 24. Typically, the part is hollow and has an internal cavity 26 which creates a labyrinth passage for cooling air which enters at the root passages 29 and exits at the trailing edge 27.

To obtain an improved blade in accord with the invention, the root section must be deformed. To accomplish this the casting is made so that the external dimensions of the root are greater than those which are desired in the article when it is ready for machining. The deformation brings the root to its desired pre-machining dimension. The root will be placed between dies made of refractory metal or ceramic and compressively deformed at strain rates of $10^{-4}$ to $10^{-1}$ cm/cm/sec, at a constant temperature, preferably 900±20° C. The rate and time of heating and temperature of deformation are those which preserve a fine gamma prime structure, necessary in the practice of the invention to get strengthening. A deformation which causes the root to be changed in dimension by 5–15% will result in a dislocation substructure which will easily provide 10–50% improvement in the 0.2% yield strength at 595° C. (i.e., nominally 600° C.), compared to the material property prior to working. Calculations show that the root will have a substructure with dislocations much higher in density (up to 10 cm/cm$^3$) than characterizes the unworked material ($\sim 10^7$ cm/cm$^3$).

In deforming the root, compressive stresses will be applied through the dies to alter the cross sectional shape in the plane transverse to the z axis. For example, the width of the root may be changed by 5–15%. Alternately, the root may be deformed by applying an axial compressive force along the z axis, so that the z axis length is changed. Straining from different directions can be combined. The precise mode or direction of deformation is optional, and tensile straining may even be used. Preferably the axis of deformation is aligned with the axis of maximum stressing as was done in our test specimen work. Whether a particular deformation is sufficient and within the scope of the invention is determinable by measuring the strength increase or dislocation density compared to a standard specimen of identical starting material. In the invention the deformation may range from 2–25% or more depending on the alloy and the crystallographic orientation lying in the direction in which the principal stress increase is desired. For the cast Alloy 1444 blade described herein, a 5–15% deformation at a temperature of 890°–990° C. will result in a z axis yield strength increase of 14–28 percent. Dislocation density of the deformed casting is increased by 2–5 orders of magnitude above the typical $10^6$–$10^7$ cm/cm$^3$ density of the casting.

The dislocation density and yield strength improvement will vary with the localized deformation in the root. The deformation may not be precisely uniform through the root, but the benefits will nonetheless be realized according to the average deformation. Further, in a blade, the highest stresses tend to occur near the external surfaces of the root and thus it is here that the deformation ought to be ensured.

Of course, overall deformation can exceed the nominal amount needed for strengthening, when it is desired to form the root to a desired external shape suited to the end use, beyond the approximate shape obtained in the casting. Generally, isothermal forging will be found to provide precise and reproducible dimensions in the practice of the invention. See U.S. Pat. No. 3,519,503 to Moore et al for a description of isothermal forming of polycrystalline materials. As is well known in the gas turbine industry the airfoil portion of a blade is precision dimensioned and is very costly to make by machining. The same may be said for the dimensions of the small internal cooling passages in the typically narrow airfoil. Thus, in the preferred practice of the invention the airfoil is not worked in any manner, so that the precision dimensions characteristic of the directional solidification investment mold casting process may be preserved.

Figure 2:
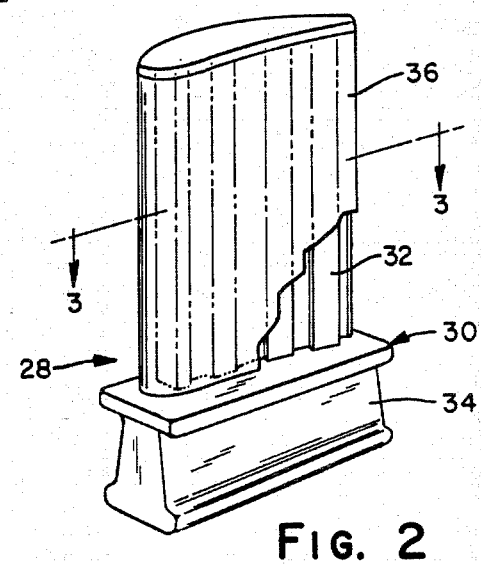
FIG. 2 shows a blade having an airfoil surface made from sheet bonded to a central spar which has been cast and worked.
Figure 3:
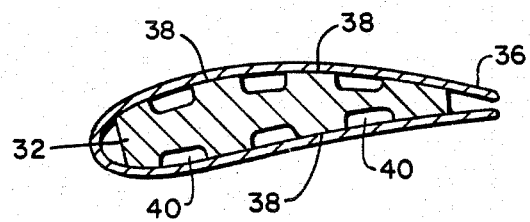
FIG. 3 is a cross section view through the air-foil portion of the blade in FIG. 2.

FIGS. 2 and 3 show another embodiment of the invention. In this case, the gas turbine blade 28 is comprised of a central member 30 which has a spar end 32 and a root end 34. The central member 30 is made of single crystal superalloy which has been deformed to provide the desirable substructure in the spar and root. Surrounding the spar and bonded thereto is a shell member 36. The shell is a piece of sheet material, preferably single crystal, which is made to closely conform to the outer surface of the spar. The shell is bonded at the joints 38 between the two members. Grooves or other patterns of depressions are provided on the external surface of the spar; when the shell is bonded to the spar, air cooling channels 40 are thus provided. In this design, since the spar is surrounded by the cooling air, it is maintained at a lower temperature than the shell which is subjected to the hot turbine gases. With substructure strengthening, the spar will be adapted to have higher yield and mechanical fatigue strength than it would have if it where not strengthened. If made of the same composition material, the shell will have relatively lower yield strength. Since the shell operates at a higher temperature it will not be deformed in accord with the invention. Of course, it may have been deformed otherwise to shape it into its sheet configuration, but this will be done at conditions which will not produce the dislocations of the present invention deformation process, so that there is no tendency for recrystallization. In another embodiment the shell can be made of a dissimilar material chosen for better oxidation, corrosion and thermal fatigue properties than the spar.

The bonding method used should be chosen to avoid recrystallization in the spar. That is, experiment with the particular alloy will show at what temperature any recrystallization takes place and how deleterious it is. Brazing and analagous processes provide a choice of bonding temperature in the range 200°–1250° C.

The spar and shell configuration is but an example of a general mode of the invention. Single crystal components, including gas turbine blades, vanes, etc., can be made as assemblies of bonded components, with selective use of deformed and nondeformed single crystal parts. See U.S. Pat. Nos. 3,967,355 and 4,033,792 of the present assignee, the disclosures of which are hereby incorporated by this reference. Creep strength at about 850° C. will be decreased in a deformed single crystal and thus a bonded-together composite article of deformed and undeformed parts will have advantage over a like article of entirely deformed parts.

As shown in FIG. 1, the root of a blade usually has air passages down its center. In one embodiment of the FIG. 1 mode of the invention, the root can be made solid and after the deformation step the air passages can be placed in the root by machining. Alternately, holes can be cast into the root to a dimension such that, after deformation, they comply with that which is desired in the final part. In another embodiment, the passages can be cast into the article and filled with metal or ceramic mandrels which would remain present during the deformation step. After deformation the mandrels can be removed by mechanical or chemical means. It is not felt that mandrels will be required except when the larger deformations are encountered, although routine use may in fact lead to a more nearly uniform state of deformation.

The dislocation forest that is associated with the substructure strengthening is expected to provide improved low cycle fatigue and thermal mechanical fatigue resistance. It is also likely that high cycle fatigue will improve for much the same reason. A corollary benefit of the invention is that the deformation will tend to close up any casting pores which may be present and also will tend to break up any inclusions which might otherwise act as fatigue origin sites.

As mentioned in the co-pending application, it is important to avoid recrystallization. For current single crystal superalloys, discontinuous static recrystallization only occurs near or above the gamma prime solvus temperature. Dynamic recrystallization only occurs at high temperatures and high rates of energy input. For the turbine blade described above neither condition would obtain during use. But if deformation were caused in portions of an article which were later subjected to high temperatures, the high temperatures would have to be limited to less than that which would cause recrystallization. If there is recrystallization, the single crystal alloys of the present invention will have very much diminished strength. Preferably, the deformed portions of an Alloy 1444 article will not exceed about 900° C. in use.

Different crystallographic axes can be aligned with different global (x, y, z) axes of the part, according to the desired set of properties being sought. Alignment of the [001] crystal axis within 20° of the z axis is most common in gas turbine blades.

The invention has been described in terms of a particular cast superalloy. Even greater enhancements in strength are indicated to be obtainable in the other cast alloys mentioned in the background, in particular the alloy PWA 1480 (Pratt & Whitney Aircraft, East Hartford, Conn.) generally described in U.S. Pat. No. 4,222,794 to Schwiezer et al. Such alloys do not have grain boundary strengtheners such as zirconium, boron and hafnium which characterized other early superalloys made in single crystal form. As a result the newer alloys have superior high temperature properties because they can be heat treated for better homogenization. However, they have compartively poor properties whenever a grain boundary is present, such as would result from recrystallization. Therefore, the prior art processes such as common forging and rolling, which involve non-isothermal working at high deformation rates are not suited for these modern alloys. However, the invention practice herein is particularly well suited for these alloys because of the particular thermal mechanical working conditions which are used. In addition to castings, the invention will also be useful with single crystals of metals made by other procedures, such as by directional recrystallization.

Although this invention has been shown and described with respect to a preferred embodiment, it will be understood by those skilled in the art that various changes in form and detail thereof may be made without departing from the spirit and scope of the claimed invention.

We claim:

1. A single crystal article made of nickel superalloy of the gamma-gamma prime type, the alloy lacking grain boundary strengtheners such as zirconium, boron and hafnium, characterized by a first portion of said part having a 0.2% yield strength at about 600° C. which is at least 15% greater than the corresponding yield strength in a second portion of the part, the first portion having had its cross sectional shape altered by deforming it 2-14% with a strain rate of less than $10^{-1}$ cm/cm/sec at a temperature in the range 700°–1100° C. to provide it with a greater density of dislocations than the second portion.

2. The article of claim 1 characterized by a first portion having been deformed at a temperature of 900°–1000° C.

3. The article of claim 1 shaped as a gas turbine blade and characterized by being made from a casting wherein the first portion is the blade root part and the second portion is the airfoil.

4. The article of claim 3 having the [001] crystallographic axis lying within 20° of the z axis of the blade.

5. A gas turbine component made of a multiplicity of bonded-together single crystal nickel superalloy parts of essentially identical composition, characterized by a first part which has been deformed 2-14% at a temperature of 700°-1100° C., and a second part which has not been deformed at a temperature of 700°-1100° C., the first part having a higher yield strength than the second part.

6. The component of claim 5 shaped as a gas turbine blade wherein the part which has been deformed is a central spar and the part which has not been deformed is a shell surrounding and attached to the spar.

* * * * *